United States Patent [19]

Ries

[11] 4,409,425
[45] Oct. 11, 1983

[54] CRYOGENICALLY STABILIZED SUPERCONDUCTOR IN CABLE FORM FOR LARGE CURRENTS AND ALTERNATING FIELD STRESSES

[75] Inventor: Günter Ries, Weingarten, Fed. Rep. of Germany

[73] Assignee: Siemens Aktiengesellschaft, Munich, Fed. Rep. of Germany

[21] Appl. No.: 329,013

[22] Filed: Dec. 9, 1981

[30] Foreign Application Priority Data

Dec. 22, 1980 [DE] Fed. Rep. of Germany ....... 3048418

[51] Int. Cl.³ ............................................ H01B 12/00
[52] U.S. Cl. ................................ 174/15 S; 174/128 S
[58] Field of Search ................ 174/15 S, 126 S, 128 S

[56] References Cited

U.S. PATENT DOCUMENTS

| | | | |
|---|---|---|---|
| 3,699,647 | 10/1972 | Bidault et al. ............... | 174/128 S X |
| 3,764,725 | 10/1973 | Kafka ................................ | 174/15 S |
| 3,983,521 | 9/1976 | Furuto et al. ............... | 174/126 S X |
| 4,195,199 | 3/1980 | Hillmann et al. ................ | 174/128 |
| 4,242,534 | 12/1980 | Marsing ............................. | 174/15 S |
| 4,254,299 | 3/1981 | Horvath et al. .................. | 174/15 S |
| 4,329,539 | 5/1982 | Tanaka ......................... | 174/15 S X |

FOREIGN PATENT DOCUMENTS

| | | |
|---|---|---|
| 2626384 | 12/1977 | Fed. Rep. of Germany ... 174/128 S |
| 2626914 | 12/1977 | Fed. Rep. of Germany . |
| 2723744 | 11/1978 | Fed. Rep. of Germany .... 174/15 S |
| 2736157 | 2/1979 | Fed. Rep. of Germany ... 174/128 S |
| 4009 | 9/1979 | Fed. Rep. of Germany .... 174/15 S |
| 2938999 | 4/1981 | Fed. Rep. of Germany ... 174/126 S |
| 54-110486 | 8/1979 | Japan ................................. 174/15 S |
| 2044737 | 10/1980 | United Kingdom ............ 174/126 S |

Primary Examiner—Fred L. Braun
Assistant Examiner—Morris H. Nimmo
Attorney, Agent, or Firm—Kenyon & Kenyon

[57] ABSTRACT

A cryogenically stabilized superconductor in cable form comprises several superconducting elements which contain twisted conductor filaments of superconductive material which are embedded in a matrix material of predetermined electric conductivity and which are twisted with several stabilizing elements of thermally and electrically highly conductive material which is electrically normal conducting at the operating temperature of the superconductor and the electric conductivity of which at the operating temperature is substantially higher than that of the matrix material of the superconducting elements disposed parallel thereto. So this superconductor will be capable of carrying large currents, will have high cryogenic stability and at the same time have only small alternating field losses, pairs of stabilizing elements and superconducting elements form respective stabilized subconductors, the stabilizing elements of which are connected in an electrically conducting manner only at individual points disposed one behind the other in the lengthwise direction of the conductor to the respective superconducting elements; and the subconductors are twisted together and are electrically insulated from each other in such a manner that an electrically highly conducting cross connection of all subconductors is provided only after one or more respective twisting lay lengths.

15 Claims, 7 Drawing Figures

CRYOGENICALLY STABILIZED SUPERCONDUCTOR IN CABLE FORM FOR LARGE CURRENTS AND ALTERNATING FIELD STRESSES

BACKGROUND OF THE INVENTION

This invention relates to superconductors in general and more particularly to a large current stabilized superconductor with low alternating field losses.

A cryogenically stabilized superconductor in cable form for large currents and alternating field stresses with several superconducting elements which contain twisted conductor filaments of superconductive material embedded in a matrix material of predetermined electric conductivity, the filaments twisted with several stabilizing elements disposed parallel thereto, is described in DE-AS No. 27 36 157. The stabilizing elements are made of thermally and electrically highly conductive material which is electrically normally conducting at the operating temperature of the superconductor. The electric conductivity of the stabilizing elements at the operating temperature is substantially higher than that of the matrix material of the superconducting elements.

The superconductive material of the conductor filaments of the elements of this known large current superconductor may be, in particular, an intermetallic compound of the type $A_3B$ with an A15 crystal structure such as $Nb_3Sn$ or $V_3Ga$. The superconducting elements of this cable each contain a multiplicity of filaments of such an intermetallic compound embedded in a bronze matrix. Such large current superconductors have good superconduction properties, are distinguished by high critical values and are therefore particularly well suited for the windings of magnets which are used to generate strong magnetic fields. Besides the mentioned superconductive binary compounds, ternary compounds such as niobium-aluminum-germanium $Nb_3Al_{0.8}Ge_{0.2}$ can be provided as conductor materials.

To ensure undisturbed continuous operation of a device equipped with superconductors such as a magnet coil or a cable, so-called cryogenic stabilization can be provided. According to this known type of stabilization, electrically and thermally highly conductive material such as copper or aluminum is added to the superconductive material of the conductor. Through good cooling of this normally conducting material, a section in the superconducting material which has become normally conducting can be returned to the superconducting state without interruption of the operation, i.e., the temperature can again drop below the transition temperature of the superconducting material even though the current is maintained.

In the large current superconductor known from DE-AS No. 27 36 157, the stabilization of the superconducting elements is achieved by arranging further special stabilizing elements of normal conducting material parallel to the superconducting elements. The stabilizing elements and the superconducting elements are twisted together to form a flat cable and can be arranged around a carried body in ribbon shape. In this conductor, adjacent superconducting and stabilizing elements are in intimate electrical and thermal contact, obtained from joint hot deformation when the conductor is formed into a flat cable. The known large current superconductor therefore has a low transversal resistance so that it has correspondingly large losses in magnetic fields that change in time.

In proposed applications of superconductive materials in large scale technical installations, requirements have been established for the superconductors to be used, which known conductor configurations do not completely meet in all respects. This relates particularly to the poloidal field coils such as the equilibrium and the transformer coils which are required in a fusion reactor constructed, for instance, according to the Tokamak principle. These coils, which serve for starting up and maintaining a plasma current, for stabilizing the plasma and for the removal of impurities, are advantageously made of superconducting material. In particular, however, these coils must meet the following specific requirements:

(a) Their conductors must carry currents of, for instance, 50 kA, so that the inductance of the coils can be kept low.

(b) Because of the large stored energy of about $10^9$ Joule, high cryogenic stability of the conductors must be assured.

(c) The alternating field losses must be kept as low as possible even for high field change rates and amplitudes, for instance, from −7 Tesla to +6 Tesla in one second when the plasma is fired.

The first two requirements call for large conductor dimensions as well as for a large percentage of electrically highly conductive stabilizing material. While both of these requirements can be met with the conductor concept known from DE-AS No. 27 36 157, the third requirement cannot be so met. For, because of the low transversal resistance, the alternating field losses are of a magnitude which can no longer be tolerated. The main cause of these losses are eddy currents which are induced in the stabilizing material, as well as between the superconducting individual wires of the overall conductor.

It is therefore an object of the present invention to improve a superconductor of the type mentioned at the outset in such a manner that it can meet the mentioned specific requirements such as must be imposed on field coils of fusion reactors.

SUMMARY OF THE INVENTION

According to the present invention, this problem is solved by forming a respective stabilized subconductor from a stabilizing element and a superconducting element with the elements connected to each other in an electrically conducting manner only at individual points disposed one behind the other in the lengthwise direction of the conductor. The subconductors are twisted together and are electrically insulated from each other in such a manner that an electrically highly conducting cross connection of all subconductors is provided only after one or more respective twisting lay lengths.

In the superconductor according to the present invention, a far-reaching physical separation of the superconducting elements from the stabilizing elements is therefore provided. A relatively poorly heat conducting connection therefore exists between these parallel elements. In addition, a moderate amount of ohmic coupling exists between these elements for reasons of the desired cryogenic stability of the superconductor which permits a transition of the current into the parallel stabilizing material when a superconducting element becomes normally conducting. The normally conducting stabilizing elements have a substantially lower electric series resistance then the superconducting elements if the latter have become normally conducting and then take over the major part of the total current flowing in the overall superconductor because of the metallic coupling between these elements. The Joule heat produced in the superconducting elements is advantageously small because of the low conductivity, and the temperature drops rapidly below the transition temperature of the superconductor because of the good cooling action from several sides. The temperature in the normally conducting stabilizing elements which adjusts itself, has only little influence on the recovery behavior of the overall conductor, contrary to the known conductor designs. Since, furthermore, the electric transversal resistance of the superconductor is large, its alternating field losses are accordingly small. It can therefore be used particularly for poloidal and toroidal field coils in plasma physics equipment such as in fusion reactors.

DETAILED DESCRIPTION

Figure 1:
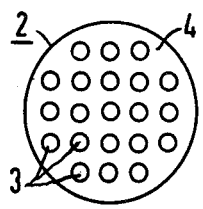
FIG. 1 is a cross-sectional view of an individual conductor used in the present invention.

The individual conductor which is shown schematically in cross section in FIG. 1, and which forms the start for constructing the superconductor according to the present invention, contains a multiplicity of superconducting conductor strands 3 which are twisted together in known manner and are embedded in a matrix 4. As matrix material, a material having an electric conductivity which is substantially smaller at the operating temperature of the superconductor than that of copper or aluminum is advantageously used. Advantageously it is at least one power of 10 smaller. Suitable materials may be used, in particular, alloys of copper or aluminum. As superconducting individual conductors, for instance, $Nb_3Sn$ filaments embedded in a copper-tin bronze matrix or Nb-Ti filaments embedded in a copper-nickel alloy matrix can be used. The individual conductors may also be, however, bundles of carbon fibers coated with niobium carbonitride in suitable matrices. The individual conductor 2 shown in the figure has an approximately round cross section. However, corresponding individual conductors with other, for instance, rectangular, cross-sectional shapes can also be used.

To fabricate the superconductor according to the present invention several of the individual conductors 2 according to FIG. 1, are combined in a bundle to form a superconducting element. According to the cross section of such a bundle conductor element 6 schematically shown in FIG. 2, eight individual conductors 2 are arranged twisted about a core 7 of an insulating or poorly conducting material such as, for instance, the material of the matrix 4. The individual conductors of this bundle are connected to each other at their common contact surfaces to form a compact element, for instance, by soldering with high resistance solder. The superconducting conductor element 6, which is so obtained, and which has a multiplicity of superconducting conductor strands embedded in its matrix material of predetermined electric conductivity, is brought to a predetermined, particularly a rectangular, cross-sectional shape, for instance, by rolling.

Figure 2:
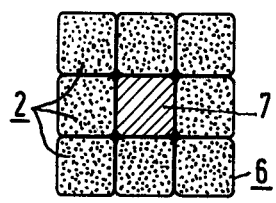
FIG. 2 is a cross-sectional view of a superconducting element, for use in a subconductor according to the present invention, constructed of individual conductors, according to FIG. 1.
Figure 3:
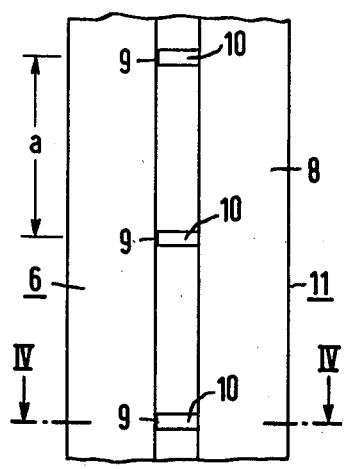
FIG. 3 is a plan view of one embodiment of a subconductor, for use in the superconductor, employing the superconducting element of FIG. 2.

According to the top view schematically shown in FIG. 3, a stabilizing element 8 is disposed parallel to the superconducting element 6 according to FIG. 2. This element 8 consists of thermally and electrically highly conductive material which, at the operating temperature of the superconductor, is electrically normally conducting and is used to stabilize the superconducting element 6. The stabilizing element 8, for instance, consisting of copper or aluminum, is connected in an electrically conducting manner to the superconducting element 6 only at individual points 9 which are located one behind the other in the longitudinal direction of the conductor, i.e., in the current carrying direction. For this purpose individual cross pieces 10 are provided which are arranged one behind the other at predetermined spacings a, transversely to the current carrying direction, and are connected via the stabilizing element 8 to the adjacent superconducting element 6, for instance, by soldering. The cross pieces 10 may form a common shaped body with the stabilizing element 8. Equally well, a zigzag shaped or lengthwise corrugated stabilizing element may also be provided which is connected to the superconducting element 6 only at its depressions or peaks. In the regions between the individual connecting points 9, no direct electrical and thermal contact therefore exists between the stabilizing element 8 and the superconducting element 6. The stabilized subconductor 11 of the superconductor according to the present invention thus composed of the superconducting element 6 and the stabilizing element 8 is shown in cross section in FIG. 4, the cross section plane being taken through the line designated with IV—IV in FIG. 3.

Figure 4:
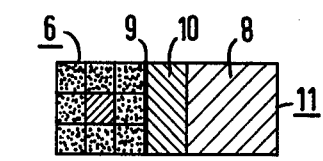
FIG. 4 is a cross-section through FIG. 3.

According to the embodiment example according to FIGS. 3 and 4 it was assumed that the stabilizing elements 8 of the subconductors 11 of the superconductor according to the present invention are connected to the respective adjacent superconducting element 6 by individual crossbars 10 arranged one behind the other in the lengthwise direction of the conductor. However, as can be seen from the oblique view shown in FIG. 5 of a superconducting subconductor 11', stabilizing elements 12 which are wavy or zigzag shaped in the longitudinal direction may also be provided. The stabilizing elements 12 are connected in an electrically conducting manner to the element 6 at their depressions or peaks facing the superconducting element 6, for instance, by soldering. The corrugations of the stabilizing elements 12 are such that a distance a is obtained between each of the electrical connecting points 9.

Figure 5:
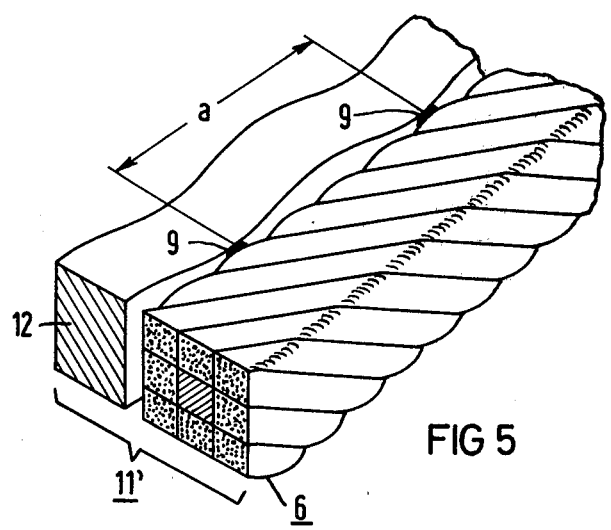
FIG. 5 is a perspective view of another embodiment of a subconductor.
Figure 6:
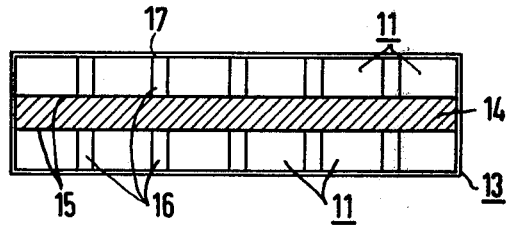
FIG. 6 is a cross section of the overall superconductor according to the present invention constructed of subconductors according to FIGS. 3 and 4 or FIG. 5.
Figure 7:
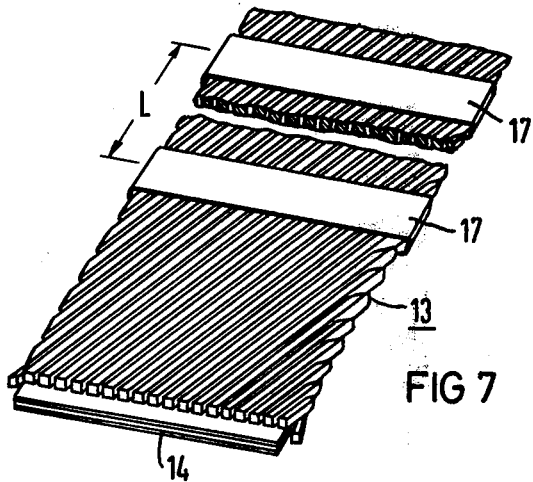
FIG. 7 is a perspective view of the superconductor of FIG. 6.

The number of stabilized subconductors according to FIGS. 3 to 5 required to obtain the specific nominal current of the superconductor is processed in parallel to form a single layer cable, for instance, a flat cable, round cable, or Roebling cable. The superconductor 13 according to the present invention which is illustrated in FIGS. 6 and 7 schematically as a cross section and in an oblique view, respectively, is assembled from a multiplicity of such subconductors 11 or 11' to form a flat cable. These subconductors are twisted around a ribbon shaped support body 14 or are arranged stranded and mutually insulated. The support body consists, for instance, of nonmagnetic material of high mechanical strength and relatively low electric and thermal conductivity such as alloy steel. It contains an insulating material at least on its outside; it is, for instance, coated with an insulating outer layer 15. The subconductors 11 or 11' are fastened mutually spaced and parallel to this support body in such a manner that a predetermined space 16 is formed between respective adjacent subconductors. The desired electric insulation between adjacent subconductors is thus assured. The space 16 can be filled out, for instance, at least in part by an electrically insulating material such as plastic. However, the spaces 16 can also remain completely empty and be filled with the cryogenic cooling medium such as liquid helium which holds the superconducting parts of the conductor at their intended operating temperature.

According to the present invention, an electrical cross connection between the subconductors 11 or 11' of the superconductor 13 is to be established after one or more twisting lay lengths, i.e., after one or more revolutions of each about the longitudinal axis of the overall conductor. This connection can be ensured, for instance, by solder bridges or clamping jaws. In the embodiment of FIGS. 6 and 7, it is assumed that the electrical connection points are arranged one behind the other in the lengthwise direction of the conductor always by a spaced distance L which is equal to one twisting lay length. The electrical connections are made, for instance, by wrappings 17 of foil of an electrically highly conductive material such as copper, which are placed around the conductor and are soldered to the subconductors. The cross section shown in FIG. 6 is taken at exactly such a point.

In addition, the superconductor 13 according to the present invention can optionally be enclosed by a coolant-tight enclosure, not shown in FIGS. 6 and 7, of a material of high strength such as alloy steel. In this manner, a hollow conductor is obtained, through which cryogenic coolant can flow in a forced stream. Enclosures of similarly constructed superconductors can be seen, for instance, from DE-OS No. 26 26 914 or DE-OS No. 28 09 513. Besides forced cooling of such a hollow conductor, however, bath cooling of the superconductor 13 can also be utilized, in which case it may be possible to dispense with such enclosures.

In the following, an example of a superconductor according to the present invention, explained with the aid of FIGS. 1 to 7, is given.

EXAMPLE

The conductor should be capable of carrying 50 kA with a field of 7 Tesla. One starts out from a superconducting individual conductor 3 of the type shown in FIG. 1 which is a niobium-titanium multifilament wire with 1 mm diameter and a short twist length. As matrix material 4 copper which was brought by integration of nickel or other materials to an electric resistivity of $2 \times 10^{-9}$ to $2 \times 10^{-8}$ ohm m is used. The ratio of matrix material to superconductor material is about 1:1. Eight such individual conductors 2 in wire form are subsequently twisted about a copper-nickel wire or a stainless steel wire 7, soldered with a high-resistance solder and compacted to form a bundled conductor element 6 of rectangular shape. The stabilizing material 8 or 12 is conducted in the form of highly conductive copper with a rectangular profile of about $3 \times 3$ mm in parallel and is connected electrically to the superconducting element at short distances a. The copper 12 can, for instance, have a zigzag-shape according to FIG. 5 and be soldered to the superconducting element 6 every 2 cm. Twenty five of these stabilized subconductors are twisted, keeping their mutual spacing, about a strip-shaped cable core 14 with a width of about 120 mm, to which previously a hardenable fiberglass-epoxy layer 15 had been applied. Such materials are known under the name "Prepreg." The subconductors are then cemented to the core by heating in such a manner that they are electrically insulated from each other. The electrical connection is always made after one twisting lay length of, for instance, 1 m by soldering on a wrapping 17 of a copper foil 1 to 2 cm wide. The 50 kA conductor fabricated in this manner is cooled in the winding either by immersion in liquid helium, or by flowing helium after enclosure into a conductor envelope.

What is claimed is:

1. In a cryogenically stabilized superconductor in cable form for large currents and alternating field stresses comprising a plurality of superconducting elements which contain twisted conductor filaments of superconductor material embedded in a matrix material of predetermined electric conductivity, said superconducting elements twisted with several stabilizing elements of thermally and electrically highly conductive material which is electrically normally conducting at the operating temperature of the superconductor and the electric conductivity of which, at the operating temperature, is substantially higher than that of the matrix material of the superconducting elements, disposed parallel thereto, the improvement comprising:
   (a) the superconductor being divided into stabilized superconducting subconductors, each comprising a superconducting element and a stabilizing element, the stabilizing element electrically connected to its respective superconducting element only at individual points dispersed one behind the other in the lengthwise direction of the superconductor;
   (b) said subconductors being twisted with each other; and
   (c) means insulating said subconductors from each other in such a manner that an electrically highly conducting cross connection of all of said subconductors is provided only after one or more twisting lay lengths.

2. The improvement according to claim 1 wherein said subconductors are twisted about a support body.

3. The improvement according to claim 2 wherein said subconductors comprise a plurality of mutually spaced subconductors disposed parallel to each other.

4. The improvement according to claim 2 wherein said support body comprises a support body of a material with low thermal and electric conductivity.

5. The improvement according to claim 2 wherein said subconductors are fastened to the support body by means for a hardenable adhesive.

6. The improvement according to claim 1 wherein said subconductors are connected in an electrically conducting manner by means of wrappings of electrically highly conductive material enclosing them, said wrappings spaced one or several twisting lay lengths from each other.

7. The improvement according to claim 1 wherein cross pieces of electrically conductive material are provided at the connecting points for the electrically conducting connection of the superconducting elements to the respective associated stablizing elements.

8. The improvement according to claim 1 wherein said stabilizing elements have a wavy or zigzag shaped form in their lengthwise direction.

9. The improvement according to claim 1 wherein the superconducting elements of the subconductors comprise several superconducting individual conductors with superconducting conductor filaments embedded in a matrix of the predetermined electric conductivity.

10. The improvement according to claim 9 wherein said several individual conductors twisted about a core of electrically poorly conducting material are combined to form a said superconducting element.

11. The improvement according to claim 9 wherein said matrix material of the superconducting individual conductors has an electric conductivity which is lower by at least a power of 10 than that of the normally conducting material of the stabilizing elements.

12. The improvement according to claim 9 comprising superconducting individual conductors with a matrix of copper-tin bronze and superconducting conductor filaments of $Nb_3Sn$.

13. The improvement according to claim 9 comprising superconducting individual conductors with a matrix of a copper-nickel alloy and superconducting conductor filaments of an Nb-Ti alloy.

14. The improvement according to claim 9 comprising superconducting individual conductors with bundles of carbon fibers coated with niobium carbonitride.

15. The improvement according to claim 1 and further including a coolant-tight enclosure of nonmagnetic material, enclosing said superconductor.

* * * * *